(12) United States Patent
Tanobe

(10) Patent No.: US 12,142,807 B2
(45) Date of Patent: Nov. 12, 2024

(54) HIGH-FREQUENCY PACKAGE INCLUDING A SUBSTRATE BODY HAVING FIRST AND SECOND COPLANAR LINES ON OPPOSITE SURFACES THEREOF CONNECTED BY A PSEUDO COAXIAL LINE WITH EXPOSED PORTIONS THEREIN

(71) Applicant: Nippon Telegraph and Telephone Corporation, Tokyo (JP)

(72) Inventor: Hiromasa Tanobe, Tokyo (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 317 days.

(21) Appl. No.: 17/765,228

(22) PCT Filed: Jul. 22, 2020

(86) PCT No.: PCT/JP2020/028466
§ 371 (c)(1),
(2) Date: Mar. 30, 2022

(87) PCT Pub. No.: WO2022/018863
PCT Pub. Date: Jan. 27, 2022

(65) Prior Publication Data
US 2022/0352613 A1    Nov. 3, 2022

(51) Int. Cl.
*H01P 5/02* (2006.01)
*H01P 3/02* (2006.01)
*H01P 3/06* (2006.01)
*H01P 5/08* (2006.01)
*H01P 11/00* (2006.01)
*H05K 3/42* (2006.01)

(52) U.S. Cl.
CPC .............. *H01P 5/028* (2013.01); *H01P 3/026* (2013.01); *H01P 3/06* (2013.01); *H01P 5/085* (2013.01); *H01P 11/003* (2013.01); *H05K 3/42* (2013.01)

(58) Field of Classification Search
CPC ......... H01P 5/028; H05K 1/0245; H05K 3/42
USPC ................................................... 333/33, 246
See application file for complete search history.

(56) References Cited

U.S. PATENT DOCUMENTS

| | | | |
|---|---|---|---|
| 9,565,750 B2* | 2/2017 | Wada | H01L 23/49894 |
| 2005/0247482 A1* | 11/2005 | Nakamura | H05K 1/115 174/262 |
| 2006/0158280 A1 | 7/2006 | Jow et al. | |
| 2009/0033442 A1* | 2/2009 | Zhao et al. | H01P 5/028 333/245 |

(Continued)

FOREIGN PATENT DOCUMENTS

| | | |
|---|---|---|
| JP | 2015015331 A | 1/2015 |
| JP | 2015050678 A | 3/2015 |

(Continued)

*Primary Examiner* — Benny T Lee
(74) *Attorney, Agent, or Firm* — Slater Matsil, LLP

(57) ABSTRACT

A pseudo coaxial line is connected to a first coplanar line at a first connecting portion and connected to a second coplanar line at a second connecting portion. The first coplanar line and the second coplanar line are, for example, differential coplanar lines. Also, a back surface concave portion in which the second connecting portion of the pseudo coaxial line is exposed is provided. The back surface concave portion is formed into an almost semicircular shape, an almost semielliptical shape, or a rectangular shape in a planar view.

12 Claims, 8 Drawing Sheets

(56) References Cited

U.S. PATENT DOCUMENTS

| | | | |
|---|---|---|---|
| 2011/0241803 A1* | 10/2011 | Tsukashima | H01P 5/02 |
| | | | 333/238 |
| 2013/0175078 A1* | 7/2013 | Pai | H05K 1/0222 |
| | | | 174/264 |
| 2014/0262469 A1 | 9/2014 | Hettler et al. | |
| 2016/0013536 A1 | 1/2016 | Song et al. | |

FOREIGN PATENT DOCUMENTS

| | | |
|---|---|---|
| JP | 5922604 B | 5/2016 |
| JP | 5964785 B | 8/2016 |
| JP | 6013280 B | 10/2016 |
| JP | 6013298 B | 10/2016 |
| JP | 6211835 B | 10/2017 |
| JP | 6213297 B | 10/2017 |

* cited by examiner

HIGH-FREQUENCY PACKAGE INCLUDING A SUBSTRATE BODY HAVING FIRST AND SECOND COPLANAR LINES ON OPPOSITE SURFACES THEREOF CONNECTED BY A PSEUDO COAXIAL LINE WITH EXPOSED PORTIONS THEREIN

CROSS-REFERENCE TO RELATED APPLICATIONS

This application is a national phase entry of PCT Application No. PCT/JP2020/028466, filed on Jul. 22, 2020, which application is hereby incorporated herein by reference.

TECHNICAL FIELD

The present invention relates to a high-frequency package including a coplanar line.

BACKGROUND

An electronic device that performs amplification processing of a high-speed high-frequency signal, an optical device that transmits/receives a high-speed optical signal, or both devices are mounted in a basic module indispensable for implementing digital coherent optical transmission. A high-frequency line having a relatively complex shape is incorporated in a package in which these devices are stored and mounted. To satisfy the requirements for the basic module, these high-frequency lines need to have a relatively excellent high-frequency characteristic for enabling propagation of a high-frequency signal without reflection and radiation. Note that as the recent structure of the high-frequency line, a high-frequency signal device package including a differential coplanar line in which two ground lines are arranged across two signal lines adjacent to each other is often used.

In a high-frequency signal device package (to be referred to as a "high-frequency package" hereinafter) of this type, to connect a differential coplanar line on the surface of a substrate in the package to a differential coplanar line on the back surface of the substrate, a pseudo coaxial line that extends through the substrate in the thickness direction of the substrate is used (see patent literatures 1 to 7).

The pseudo coaxial line here means a high-frequency line having a structure similar to that of a general coaxial cable. As a characteristic feature, a coaxial cable includes one conductor (single-phase coaxial cable) or two conductors (differential coaxial cable) at the center of the cross section thereof. An earthing ground is provided to surround this in a circumferential shape (generally observed in a single-phase coaxial cable), or in an elliptical shape or a race-track shape (generally observed in a differential coaxial cable). In addition, an insulator fills between the center conductor and the earthing ground.

However, it is difficult in principle to introduce the earthing ground having a circumferential shape, an elliptical shape, or a race-track shape into the substrate constituting the high-frequency package such that it continuously extends through the substrate in the thickness direction. Hence, as an alternative, earthing ground vias extending through the substrate are introduced at a predetermined interval in an array conforming to a circumferential shape, an elliptical shape, or a race-track shape. This is generally called a "pseudo coaxial line."

RELATED ART LITERATURE

Patent Literature

Patent Literature 1: Japanese Patent No. 5922604, published May 24, 2016
Patent Literature 2: Japanese Patent No. 5964785, published Aug. 3, 2016
Patent Literature 3: Japanese Patent No. 6013280, published Oct. 25, 2016
Patent Literature 4: Japanese Patent No. 6013296, published Oct. 25, 2016
Patent Literature 5: Japanese Patent No. 6013297, published Oct. 25, 2016
Patent Literature 6: Japanese Patent No. 6013298, published Oct. 25, 2016
Patent Literature 7: Japanese Patent No. 6211835, published Oct. 11, 2016.

SUMMARY OF THE INVENTION

Problem to be Solved by Embodiments of the Invention

In the conventional technique, however, in the connecting (coupling) portion between the differential coplanar line and the pseudo coaxial line, mismatching of characteristic impedance occurs. In addition, radiation toward an outer peripheral portion with which the connecting (coupling) portion makes an almost right angle occurs for a high-frequency signal in principle, reflection and radiation of a signal including a higher frequency band simultaneously occur, and signal transmission degrades as a result.

Embodiments of the present invention have been made to solve the above-described problems, and has as its object to obtain matching of characteristic impedance in a connecting portion between a coplanar line and a pseudo coaxial line, when the coplanar line and the pseudo coaxial line make an almost right angle, prevent a high-frequency signal from leaking because it cannot be completely bent at the connecting portion, and smoothly perform propagation of a high-frequency signal without reflection in the connecting portion.

Means of Solution to the Problem

According to embodiments of the present invention, there is provided a high-frequency package comprising a package main body including a substrate formed of alternately laminated insulating layers and conductor layers, a first coplanar line formed on a surface of the substrate, a second coplanar line formed on a back surface of the substrate on a mounting surface of the package main body, a pseudo coaxial line formed to extend through the substrate, connected to the first coplanar line at a first connecting portion, and connected to the second coplanar line at a second connecting portion, a first signal lead pin arranged on of the mounting surface of the package main body and having one end connected to a first signal line of the second coplanar line, a second signal lead pin arranged on the mounting surface of the package main body and having one end connected to a second signal line of the second coplanar line, and a ground lead pin arranged on the mounting surface of the package main body and having one end connected to a ground line of the second coplanar line, wherein the high-frequency package further comprises at least one of a surface concave portion which is formed on the surface of the substrate and in which the first connecting portion of the pseudo coaxial line is exposed, and a back surface concave portion which is formed on a back surface of the substrate and in which the second connecting portion of the pseudo coaxial line is exposed.

Effect of Embodiments of the Invention

As described above, according to embodiments of the present invention, a concave portion is formed in the depth direction of the insulator layer in the connecting portion between the coplanar line and the pseudo coaxial line. It is therefore possible to obtain matching of characteristic impedance in the connecting portion between the coplanar line and the pseudo coaxial line, when the coplanar line and the pseudo coaxial line make an almost right angle, prevent a high-frequency signal from leaking to the outside because it cannot be completely bent at the connecting portion, and smoothly perform propagation of the high-frequency signal without reflection in the connecting portion.

DETAILED DESCRIPTION OF ILLUSTRATIVE EMBODIMENTS

A high-frequency package according to an embodiment of the present invention will now be described where like feature are denoted by the same reference label throughout the detail description of the drawings.

First Embodiment

A high-frequency package 100 according to the first embodiment of the present invention will be described first with reference to FIGS. 1A, 1B, 1C, and 1D. The high-frequency package 100 includes a package main body 101 (see FIGS. 1A, 1B, and 1C), a first coplanar line 102 (see FIGS. 1A, 1C, and 1D), a second coplanar line 103 (see FIGS. 1B and 1D), and a pseudo coaxial line 104 (See FIGS. 1C and 1D). Each of the first coplanar line 102 (see FIGS. 1A, 1C, and 1D) and the second coplanar line 103 (see FIGS. 1B and 1D) is, for example, a differential coplanar line. Note that FIG. 1B shows the mounting surface of the package main body 101, and FIG. 1C shows a partially cutaway cross section.

Figure 1A:
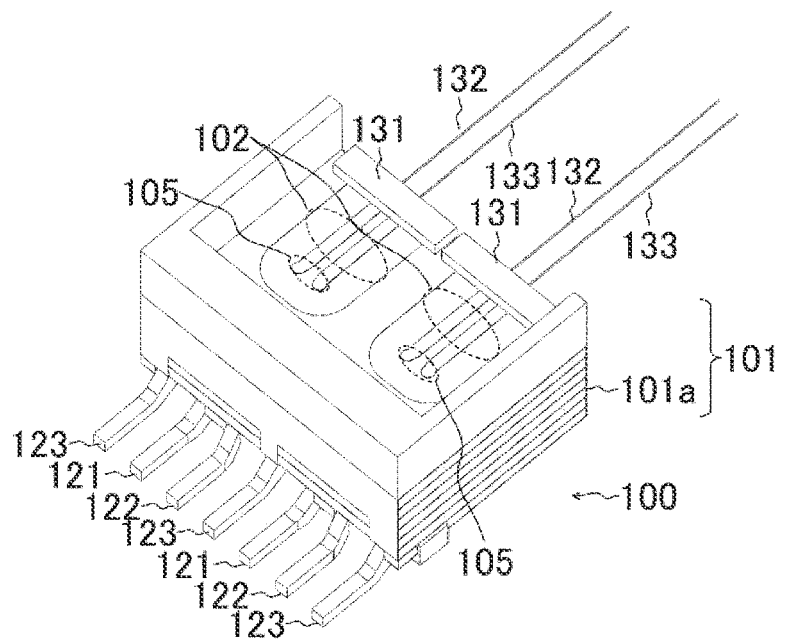
FIG. 1A is a perspective view showing the configuration of a high-frequency package according to the first embodiment of the present invention.
Figure 1B:
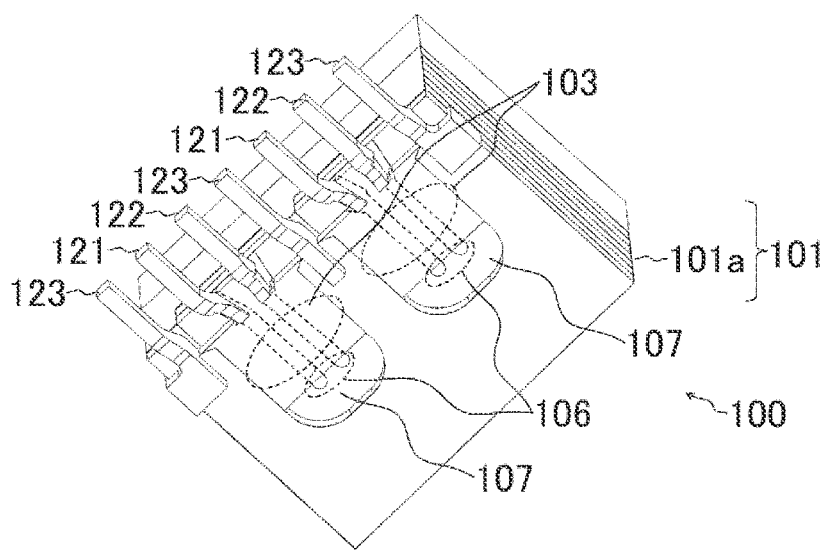
FIG. 1B is a perspective view showing the configuration of the high-frequency package according to the first embodiment of the present invention.
Figure 1C:
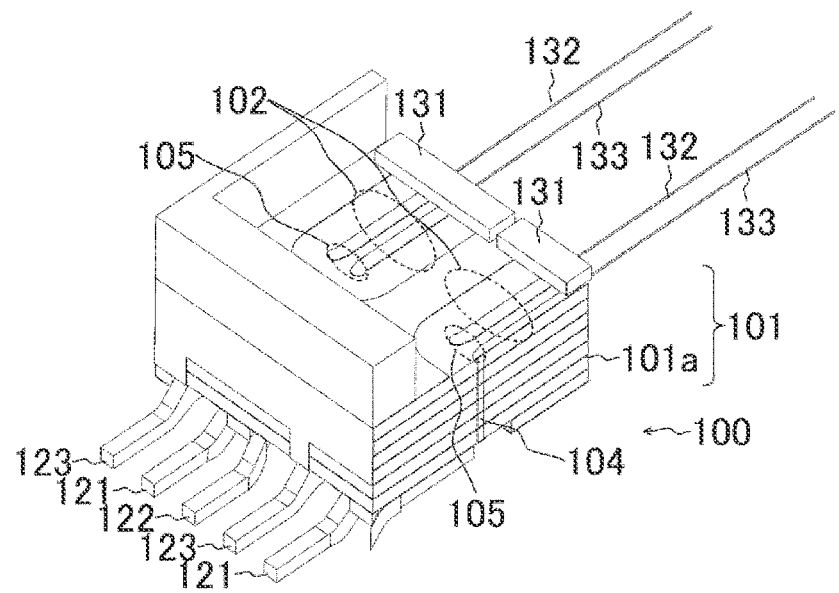
FIG. 1C is a perspective view showing the configuration of the high-frequency package according to the first embodiment of the present invention.
Figure 1D:
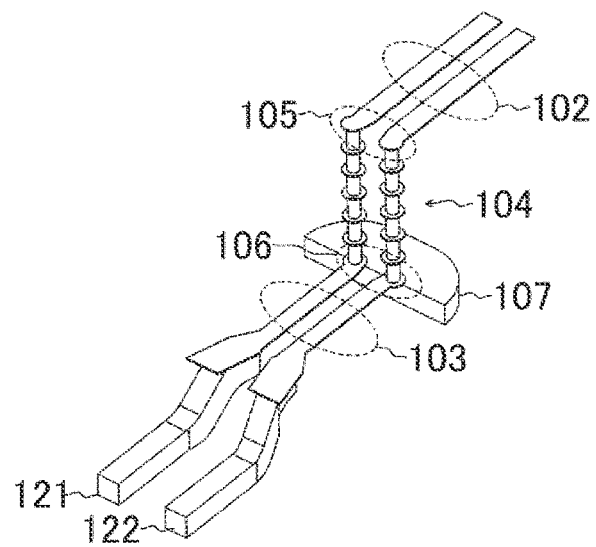
FIG. 1D is a perspective view showing a partial configuration of the high-frequency package according to the first embodiment of the present invention.

The package main body 101 (see FIGS. 1A, 1B, and 1C) includes a substrate 101a (see FIGS. 1A, 1B, and 1C) formed by alternately laminated insulating layers each made of an insulator (dielectric) and conductor layers each made of a conductor foil or the like, and the first coplanar line 102 (see FIGS. 1A, 1C, and 1D) is formed on the surface of the substrate 101a (see FIGS. 1A, 1B, and 1C). In addition, as shown in FIG. 1B, the second coplanar line 103 is formed on the back surface of the substrate 101a on the mounting surface of the package main body 101. As shown in FIGS. 1C and 1D, the pseudo coaxial line 104 is formed to extend through the substrate 101a (see FIG. 1C), and is connected to the first coplanar line 102 at a first connecting portion 105 (see FIGS. 1A, 1C and 1D), and connected to the second coplanar line 103 at a second connecting portion 106 (see FIG. 1D). Note that in FIG. 1D, the substrate 101a around the line is omitted, and the differential center conductor extending through the substrate 101a is mainly shown.

The shape of a back surface concave portion 107 shown in FIG. 1D means a region to selectively remove the insulator (dielectric) to be described later. Note that when forming the pseudo coaxial line, it is a known fact that at the highest frequency (in general, a 3 dB bandwidth (f3 dB) frequency or a 6 dB bandwidth (f6 dB) frequency is known) used by a high-frequency signal, it is generally necessary to arrange a plurality of earthing ground through vias at a distance interval corresponding to (⅛=0.125) to (¼=0.250) of a wavelength in a waveguide using an insulator (dielectric) as a material. Hence, in the first embodiment, to avoid complexity of the drawings, the earthing ground through vias in the package main body 101 are not illustrated.

For example, in FIGS. 1A and 1C, on the substrate 101a, a photoelectric conversion chip 131 is connected to the input and output terminals of the first coplanar line 102. Conversion between an optical signal and a high-frequency electrical signal is performed between an optical fiber 132 and an optical fiber 133 connected to the photoelectric conversion chip 131 as shown in FIGS. 1A and 1C. The photoelectric conversion chip 131 (see FIGS. 1A and 1C) has, for example, a differential amplification type photoelectric conversion function by two photodiodes.

In addition, as detailed in FIGS. 1A, 1B, and 1C, the high-frequency package 100 includes a first signal lead pin 121, a second signal lead pin 122, and a ground lead pin 123.

The first signal lead pin 121 is arranged on the mounting surface of the package main body 101 and has one end connected to a first signal line of the second coplanar line 103 (see FIGS. 1B and 1D). The second signal lead pin 122 is arranged on the mounting surface of the package main body 101 and has one end connected to a second signal line of the second coplanar line 103 (see FIGS. 1B and 1D). The ground lead pin 123 is arranged on the mounting surface of the package main body 101 and has one end connected to the ground line of the second coplanar line 103 (see FIG. 1B).

Note that the substrate 101a has a structure formed of alternately laminated a plurality of metal layers (conductor layers) made of a metal foil or the like and insulating layers. The metal layers are electrically connected by earthing ground vias (not shown) formed to vertically extend through the insulating layers and are connected to the ground line. The ground line is set to the same potential as a metal that is a part of a housing material that forms the high-frequency package and it therefore also called a "package ground" in general.

In addition to the above-described configuration, as shown in FIG. 1B, the high-frequency package 100 includes the back surface concave portion 107 which is formed on the back surface of the substrate 101a and in which the second connecting portion 106 of the pseudo coaxial line 104 (see FIG. 1D) is exposed. The back surface concave portion 107 (see FIG. 1B) is a portion in which the insulator on the second connecting portion 106 is removed. Note that the first signal line and the second signal line of the second coplanar line 103 (see FIGS. 1B and 1D) are formed while being embedded in the substrate 101a (see FIG. 1B), and the back surface concave portion 107 (see FIG. 1B) is formed on the back surface of the substrate 101a (see FIG. 1B) in a region where the first signal line and the second signal line of the second coplanar line 103 (see FIG. 1B) are not formed. The back surface concave portion 107 (see FIG. 1B) can have an almost semicircular shape, an almost semielliptical shape, or a rectangular shape in a planar view.

According to the above-described first embodiment, when the back surface concave portion 107 is provided, the insulator on the second connecting portion 106 is removed, and the second connecting portion 106 is exposed. In this region, the relative permittivity near the high-frequency line (signal line) is close to 1 that is the relative permittivity of a gas such as air or vacuum. For example, if an inorganic material such as ceramic is introduced into an insulator layer, its relative permittivity is almost 9. For this reason, the difference from about 1 that is the relative permittivity of a gas such as air or vacuum is clear. Hence, exhibition of an electrical capacitance with respect to the ground potential in the second connecting portion 106 is suppressed.

In general, the characteristic impedance of the high-frequency line is in inverse proportion to the root ($\sqrt{}$) of the electrical capacitance of the high-frequency line. In addition, it is a known fact that the characteristic impedance in the bent portion of the high-frequency line effectively causes rise of the electrical capacitance. It is also known that a high-frequency component of a high-frequency signal cannot be completely bent at the bent portion and radiates to the outside.

For this reason, when the back surface concave portion 107 is provided, the lowering of the characteristic impedance in the second connecting portion 106 is suppressed by the effect of the reciprocal of $\sqrt{(1/9)}$, that is, about three times. Also, as the same time, since the effect of suppressing the rise of the electrical capacitance can also selectively be obtained at the same time only on the outer peripheral portion of the bent portion, the high-frequency signal is hardly radiated. This is because the high-frequency signal generally physically has such an electromagnetic characteristic that it is drawn to a portion of a high capacitance. Hence, reflection and radiation of the high-frequency signal at the second connecting portion 106 are simultaneously reduced. As a result, the high-frequency signal can be propagated without loss between the pseudo coaxial line 104 and the second coplanar line 103.

From the second coplanar line 103 to the pseudo coaxial line 104, a shape bent almost at a right angle is formed in the second connecting portion 106. In the bent high-frequency line, it is a known fact that when the electrical capacitance generated in the bent portion (connecting portion) rises in general, the characteristic impedance in the bent portion lowers. The characteristic impedance of the bent portion is lower than the characteristic impedance that the high-frequency line originally has. For this reason, the high-frequency signal is reflected in the bent portion, and propagation of the high-frequency signal is impeded.

In the bent portion formed in the same plane as the high-frequency line, a chamfered shape is introduced, as a measure to reduce the electrical capacitance, to each outer peripheral vertex of the bent portion of the signal line that forms the high-frequency line. This shape makes it possible to avoid the above-described problem, as is known in general. This configuration can reduce the conductor area of the signal line that forms the high-frequency line in the bent portion and reduce the electrical capacitance in the bent portion.

On the other hand, in the high-frequency line that is not formed in the same plane and is bent in a so-called substrate vertical direction, the above-described conventional technique cannot be applied in the same plane. For this reason, in patent literatures 1 to 7, proposals have been made concerning the shape of a conductor thin film that forms a ground plane at each end of a pseudo coaxial line that is a high-frequency line extending through a substrate, or addition of a new conductor to form a ground plane.

Figure 1E:
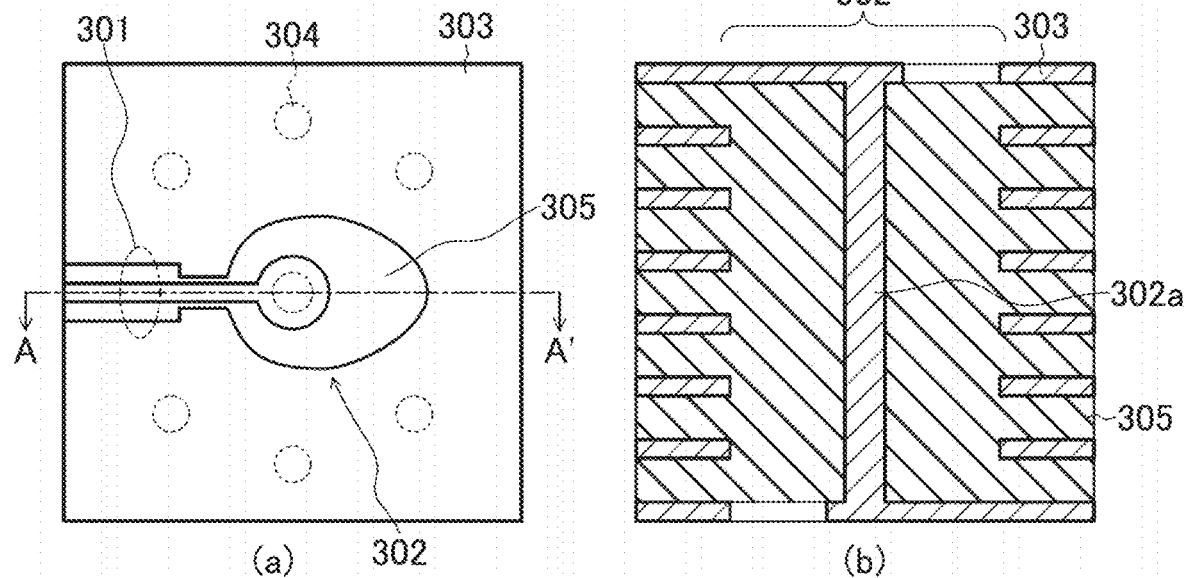
FIG. 1E is a view showing the configuration of a high-frequency line of a conventional technique.

For example, as shown in FIG. 1E, in patent literature 1, at an end portion of a single-phase pseudo coaxial line 302 connected to a single-phase coplanar line 301 (in (a) of FIG. 1E), the starting position of a ground plane 303 in the bending outer peripheral direction viewed from a signal line (center conductor) 302a (in (b) of FIG. 1E) is changed, and rise of the electrical capacitance at a portion bent at a right angle at an end portion of the pseudo coaxial line 302 is suppressed, thereby suppressing lowering of the characteristic impedance in this portion. Note that in FIG. 1E, (b) shows a cross section taken along a line A-A' in (a). Reference numeral 304 (in (a) of FIG. 1E) denotes an earthing ground through via.

Figure 1F:
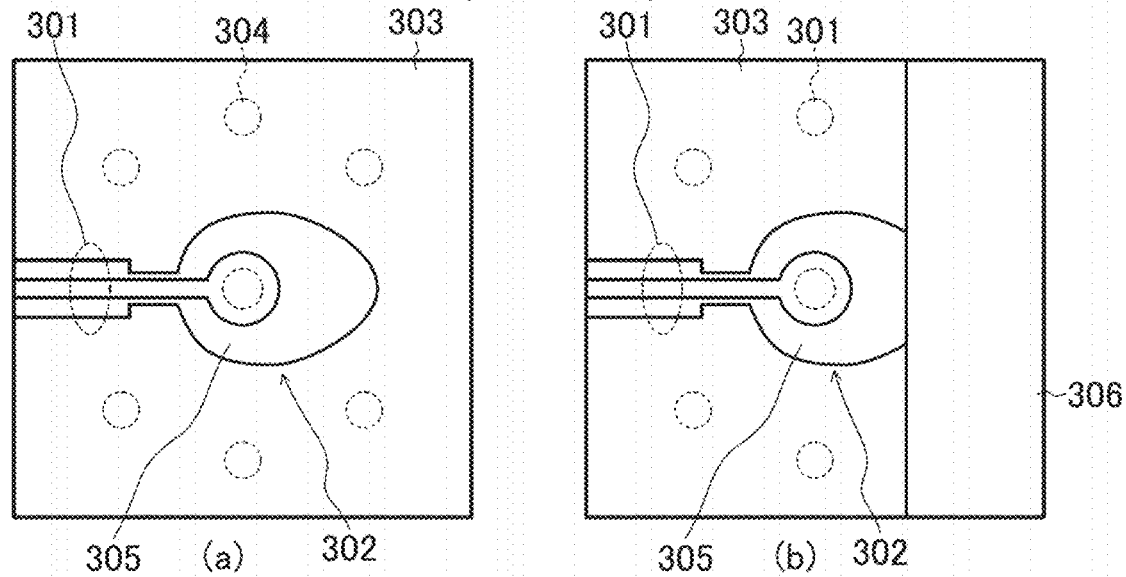
FIG. 1F is a view showing the configuration of the high-frequency line of the conventional technique.

However, as shown in (a) of FIG. 1F, if a material having a relative high relative permittivity is used for an insulating layer 305 that forms the high-frequency line, the starting position of the ground plane 303 needs to be made farther away from the signal line. At this time, as shown in (b) of FIG. 1F, if a wall 306 (in (a) of FIG. 1F) that is made of a metal or an insulator and constructs the structure of the package is provided near the starting position of the ground plane 303, the application destination of patent literature 1 is limited. That is, it can be said that the conventionally known patent techniques are not necessarily sufficient in the viewpoint of generalization for insulating materials which exhibit insulating properties and are used when forming a high-frequency package in all broad fields.

As compared to these conventional techniques, according to the first embodiment, a very simple and easily implementable structure is employed, thereby ensuring matching of characteristic impedance in the connecting portion between the coplanar line such as a differential coplanar line and the pseudo coaxial line and propagating a high-frequency signal between these without loss.

According to the first embodiment as shown in FIGS. 1A-1D, the concave portion is designed and formed into a desired shape, thereby giving a degree of freedom to the design of the characteristic impedance in the second connecting portion 106 as shown in FIGS. 1B and 1D. In addition, when providing the concave portion, it is selectively formed only on the almost outer periphery of the connecting portion. This can suppress lowering of the electrical capacitance selectively and spatially on the almost outer periphery and suppress leakage of the high-frequency signal to the external space even in the second connecting portion. It is therefore possible to ensure matching of the characteristic impedance in the second connecting portion 106, simultaneously achieve suppression of leakage of the high-frequency signal to the space, and improve the transmission characteristic of signal transmission via the high-frequency package 100 as shown in FIG. 1B.

Second Embodiment

Figure 2:
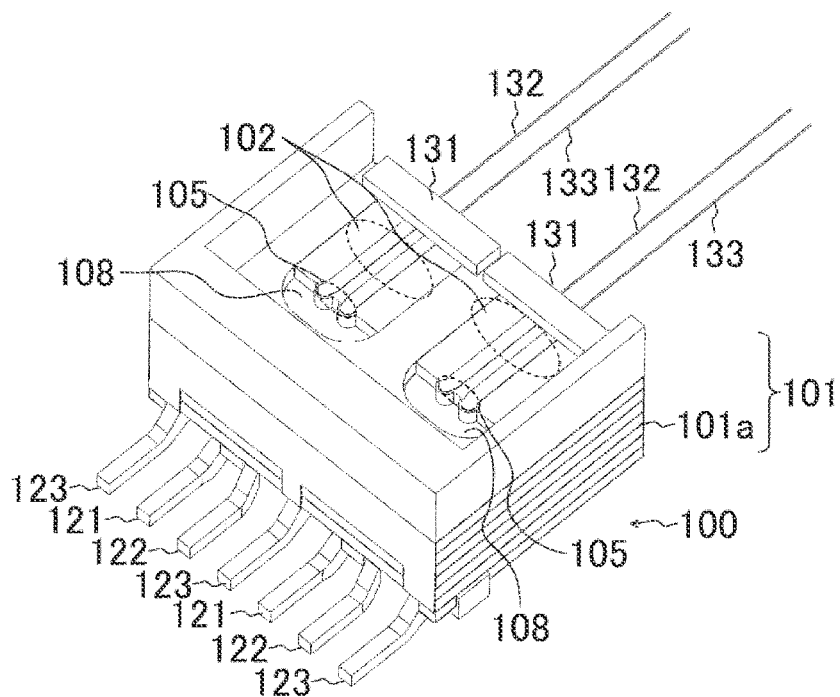
FIG. 2 is a perspective view showing the configuration of a high-frequency package according to the second embodiment of the present invention.

The second embodiment of the present invention will be described next with reference to FIG. 2. In the above-described first embodiment, the back surface concave portion 107 is provided on the back surface of the substrate 101a. As shown in FIG. 2, a surface concave portion 108 may be provided on the surface of a substrate 101a. The surface concave portion 108 is formed on the surface of the substrate 101a. In the surface concave portion 108, a part of an insulator is removed in a region near a first connecting portion 105 of a pseudo coaxial line 104 as shown in FIGS. 1C and 1D. FIG. 2 shows a state in which in the surface concave portion 108, an insulator layer that forms the pseudo coaxial line 104 is partially cut away in the thickness direction of the substrate 101a. Note that a thin insulating layer is formed on the surface of the center conductor of the pseudo coaxial line 104. The surface concave portion 108 can have an almost semicircular shape, an almost semielliptical shape, or a rectangular shape in a planar view. Note that in the second embodiment, a back surface concave portion 107 may be provided, as in the first embodiment.

Note that when forming the pseudo coaxial line, it is a known fact that at the highest frequency (in general, a 3 dB bandwidth (f3 dB) frequency or a 6 dB bandwidth (f6 dB) frequency is known) used by a high-frequency signal, it is generally necessary to arrange a plurality of earthing ground through vias at a distance interval corresponding to ($\frac{1}{8}$=0.125) to ($\frac{1}{4}$=0.250) of a wavelength in a waveguide using an insulator (dielectric) as a material. Hence, in FIG. 2, to avoid complexity, the earthing ground through vias in a package main body 101 are not illustrated.

According to the second embodiment, when the surface concave portion 108 is provided, a part of the insulator that forms the pseudo coaxial line 104 on the first connecting portion 105 is removed. In this region, the relative permittivity near the high-frequency line (signal line) is close to 1 that is the relative permittivity of a gas such as air or vacuum. For example, if an inorganic material such as ceramic is introduced into an insulator layer, its relative permittivity is almost 9. For this reason, the difference from about 1 that is the relative permittivity of a gas such as air or vacuum is clear. Hence, exhibition of an electrical capacitance with respect to the ground potential in the first connecting portion 105 is suppressed.

In general, the characteristic impedance of the high-frequency line is in inverse proportion to the root (V) of the electrical capacitance of the high-frequency line. In addition, it is a known fact that the characteristic impedance in the bent portion of the high-frequency line effectively causes rise of the electrical capacitance. It is also known that a high-frequency component of a high-frequency signal cannot be completely bent at the bent portion and radiates to the outside. For this reason, when the surface concave portion 108 is provided, the lowering of the characteristic impedance in the first connecting portion 105 is suppressed by the effect of the reciprocal of $\sqrt{1/9}$, that is, about three times.

Also, at the same time, since the effect of suppressing the rise of the electrical capacitance can also selectively be obtained at the same time only on the outer peripheral portion of the bent portion, the high-frequency signal is hardly radiated. This is because the high-frequency signal generally physically has such an electromagnetic characteristic that it is drawn to a portion of a high capacitance. Hence, reflection and radiation of the high-frequency signal at the first connecting portion 105 are simultaneously reduced. As a result, the high-frequency signal can be propagated without loss between the pseudo coaxial line 104 and a first coplanar line 102.

As described above, in the second embodiment as well, it is possible to ensure matching of characteristic impedance in the connecting portion between the differential coplanar line and the pseudo coaxial line and propagate a high-frequency signal between the differential coplanar line and the pseudo coaxial line without loss. According to the second embodiment, the concave portion is designed and formed into a desired shape, thereby giving a degree of freedom to the design of the characteristic impedance in the first connecting portion 105.

In addition, when providing the concave portion, the concave portion is selectively formed only around the outer periphery of the connecting portion. This can suppress lowering of the electrical capacitance selectively and spatially on the outer periphery and suppress leakage of the high-frequency signal to the external space even in the second connecting portion. It is therefore possible to ensure matching of the characteristic impedance in the first connecting portion 105, simultaneously achieve suppression of leakage of the high-frequency signal to the space, and improve the transmission characteristic of signal transmission via the high-frequency package 100.

Third Embodiment

Figure 3A:
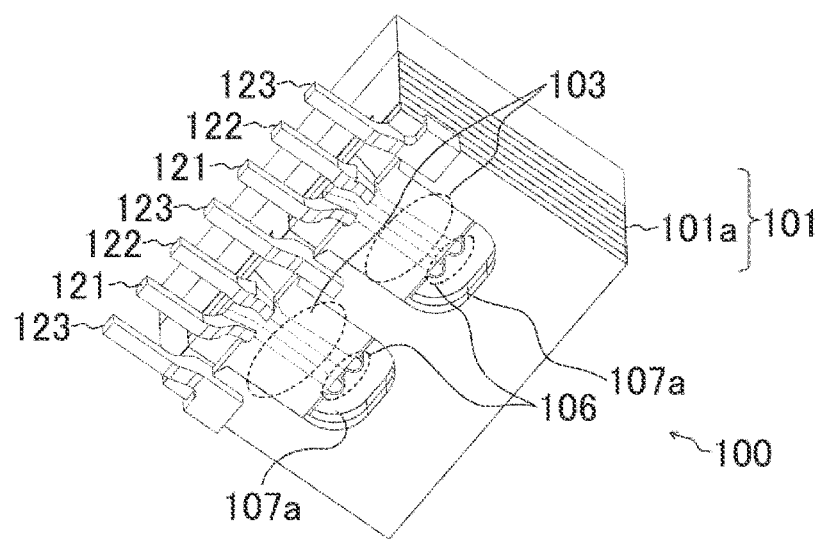
FIG. 3A is a perspective view showing the configuration of a high-frequency package according to the third embodiment of the present invention.
Figure 3B:
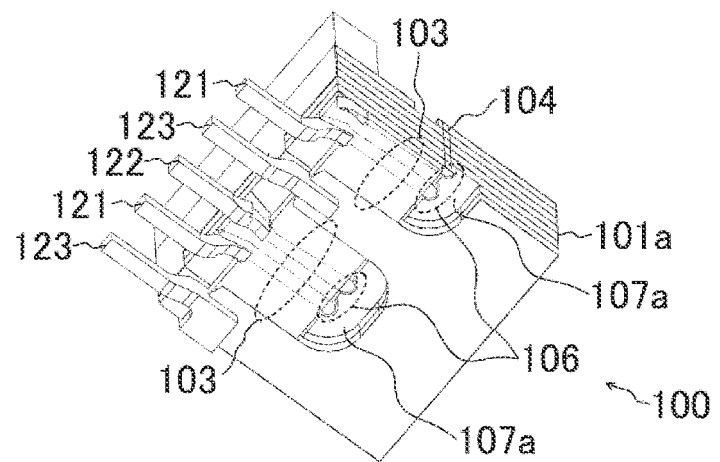
FIG. 3B is a perspective view showing the configuration of the high-frequency package according to the third embodiment of the present invention.
Figure 3C:
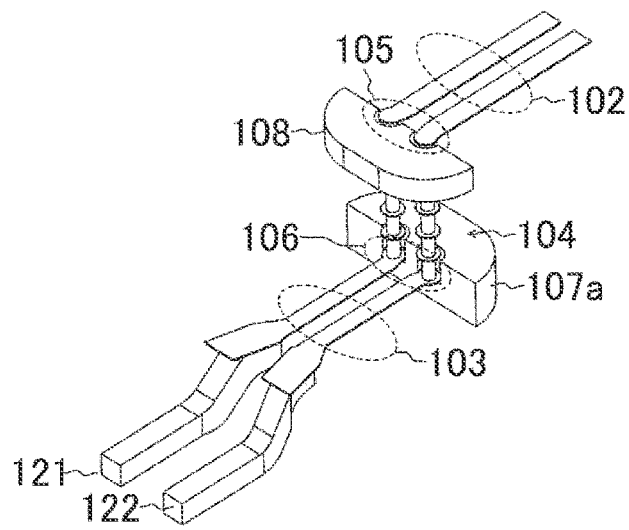
FIG. 3C is a perspective view showing a partial configuration of the high-frequency package according to the third embodiment of the present invention.

The third embodiment of the present invention will be described next with reference to FIGS. 3A, 3B, and 3C. FIG. 3A shows the mounting surface of a package main body 101, and FIG. 3B shows a partially cutaway cross section. FIG. 3C shows a structure without a substrate 101a around lines, and mainly shows a differential center conductor extending through the substrate. The shapes of portions 107a and 108 shown in FIG. 3C mean regions to selectively remove an insulator (dielectric) to be described later.

Note that when forming the pseudo coaxial line, it is a known fact that at the highest frequency (in general, a 3 dB bandwidth (f3 dB) frequency or a 6 dB bandwidth (f6 dB) frequency is known) used by a high-frequency signal, it is generally necessary to arrange a plurality of earthing ground through vias at a distance interval corresponding to (⅛=0.125) to (¼=0.250) of a wavelength in a waveguide using an insulator (dielectric) as a material. Hence, in FIGS. 3A, 3B, and 3C, to avoid complexity, the earthing ground through vias in the package main body 101 are not illustrated.

In the third embodiment, first, the surface concave portion 108 which is formed on the surface of the substrate 101a and in which a part of an insulator is removed in a first connecting portion 105 (see FIG. 3C) of a pseudo coaxial line 104 (see FIG. 3B) is provided. This configuration is the same as in the above-described second embodiment. In the third embodiment, the back surface concave portion 107a which is formed on the back surface of the substrate 101a (see FIG. 3B) and in which a second connecting portion 106 of the pseudo coaxial line 104 (FIGS. 3B and 3C) is exposed is provided. In the back surface concave portion 107a, a part of the insulator of the pseudo coaxial line 104 is removed to the inside of the substrate 101a. Note that the rest of the configuration is the same as in the above-described first embodiment.

According to the third embodiment, since a part of the insulator of the pseudo coaxial line 104 is removed in the second connecting portion 106, reflection of a high-frequency signal in the second connecting portion 106 can further be reduced.

Fourth Embodiment

Figure 4:
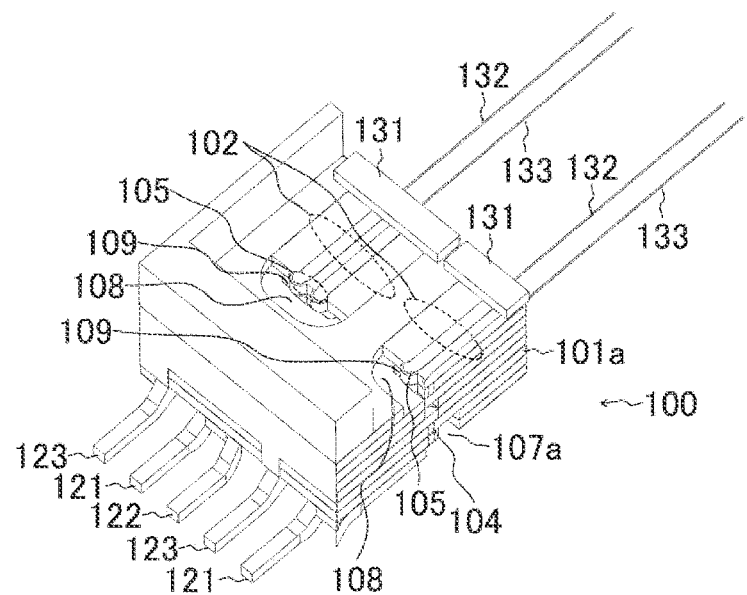
FIG. 4 is a perspective view showing the configuration of a high-frequency package according to the fourth embodiment of the present invention.

The fourth embodiment of the present invention will be described next with reference to FIG. 4. In the fourth embodiment, concerning a substrate 101a, a hole portion 109 is formed in the substrate 101a in the substrate thickness direction more than a surface concave portion 108. The hole portion 109 is a part in which of an insulator between the differential center conductors of a pseudo coaxial line 104 is removed. In the fourth embodiment, in the hole portion 109, not only the insulator between the differential lines of the pseudo coaxial line 104 but also the insulator between the differential lines on the opposite side is also partially removed. The rest of the configuration is the same as in the above-described third embodiment.

According to the fourth embodiment, since the hole portion 109 is provided, in the region of the pseudo coaxial line 104 in the hole portion 109, the relative permittivity between the differential lines is close to 1 that is the relative permittivity of a gas such as air or vacuum, and exhibition of an electrical capacitance with respect to the ground potential is suppressed. As a result, according to the fourth embodiment, the transmission loss in the pseudo coaxial line 104 can further be suppressed.

Fifth Embodiment

Figure 5A:
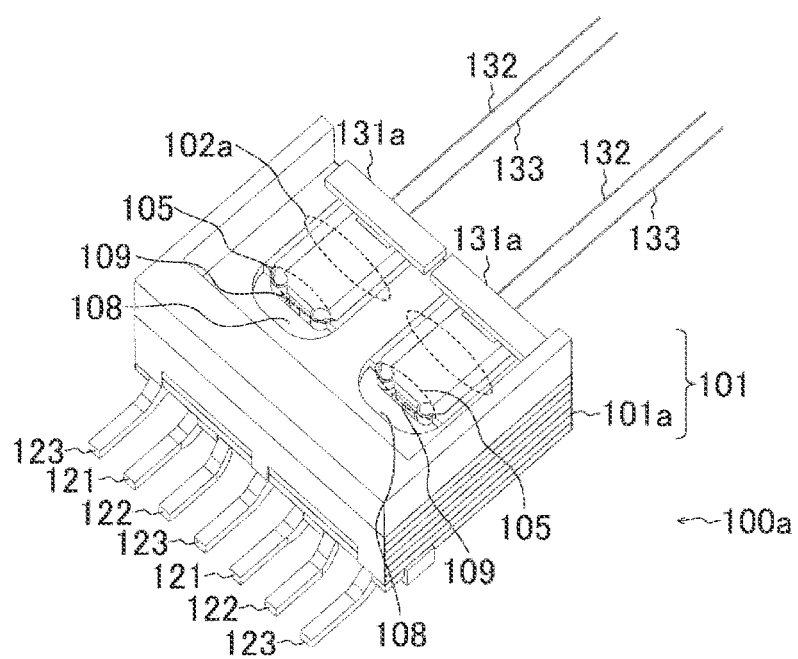
FIG. 5A is a perspective view showing the configuration of a high-frequency package according to the fifth embodiment of the present invention.
Figure 5B:
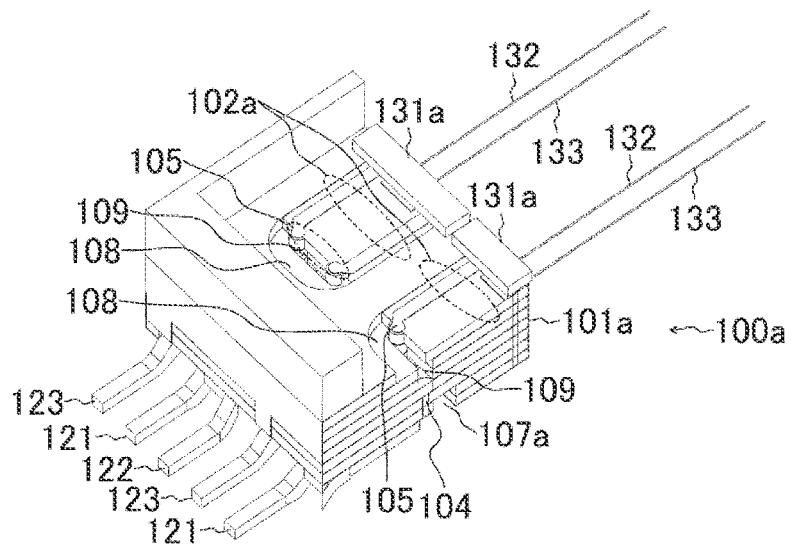
FIG. 5B is a perspective view showing the configuration of the high-frequency package according to the fifth embodiment of the present invention.
Figure 5C:
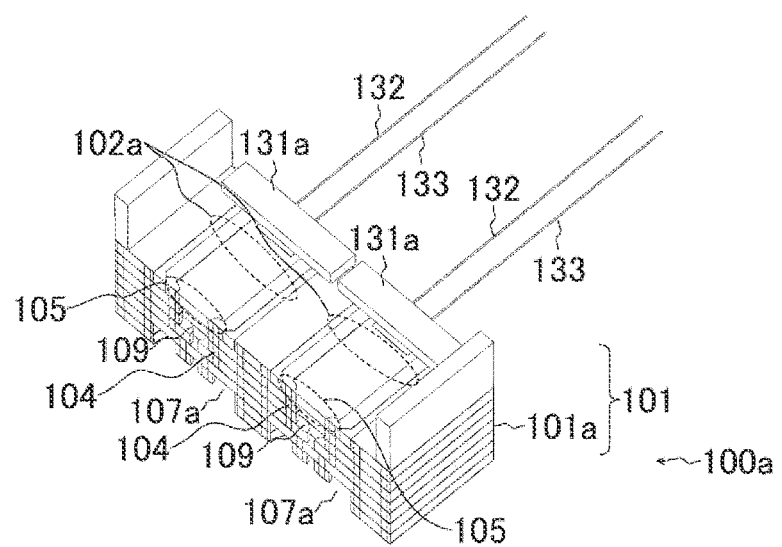
FIG. 5C is a perspective view showing the configuration of the high-frequency package according to the fifth embodiment of the present invention.

A high-frequency package 100a according to the fifth embodiment of the present invention will be described next with reference to FIGS. 5A, 5B, and 5C. In a high-frequency package 100a, two single-phase side couple line structures are formed in which the interval between two high-frequency lines 102a is increased to weaken electromagnetic coupling generated between these and strengthen electromagnetic coupling to a ground conductor foil adjacent in the longitudinal direction.

With this configuration, it is possible to mount a photoelectric conversion chip 131a in which two photoelectric conversion functions with a single-end high-frequency interface formed by one photodiode or the like are monolithically integrated. Hence, in this configuration, for each of optical signals propagated through an optical fiber 132 and an optical fiber 133, even the photoelectric conversion chip in which two photoelectric conversion functions with a single-end high-frequency interface are monolithically integrated can execute conversion between an optical signal and a high-frequency electrical signal. The rest of the configuration is the same as in the above-described fourth embodiment.

According to the fifth embodiment, by the two high-frequency lines 102a and a second coplanar line 103 (see FIGS. 3B and 3C), conversion between a differential coupling high-frequency line and a single-end high-frequency line, whose structures are different from each other, can easily be performed.

Sixth Embodiment

Figure 6A:
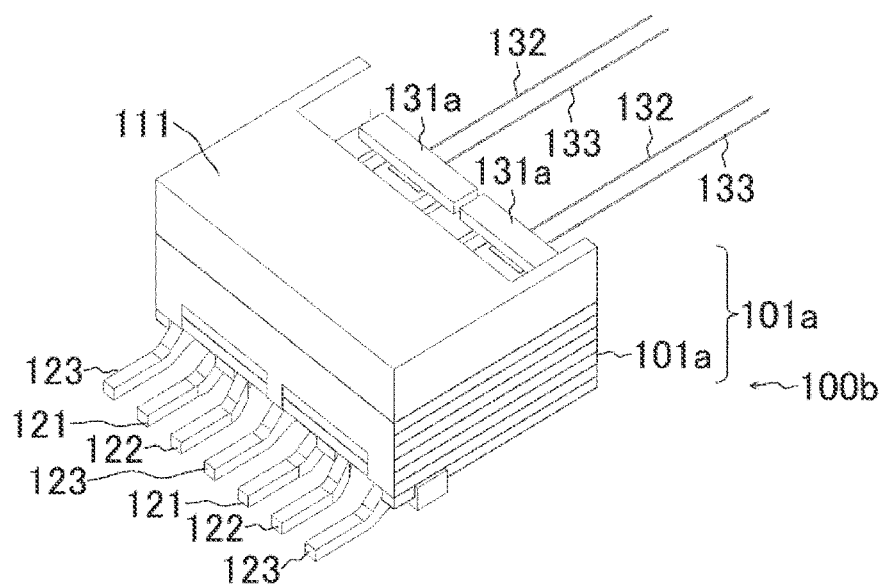
FIG. 6A is a perspective view showing the configuration of a high-frequency package according to the sixth embodiment of the present invention.
Figure 6B:
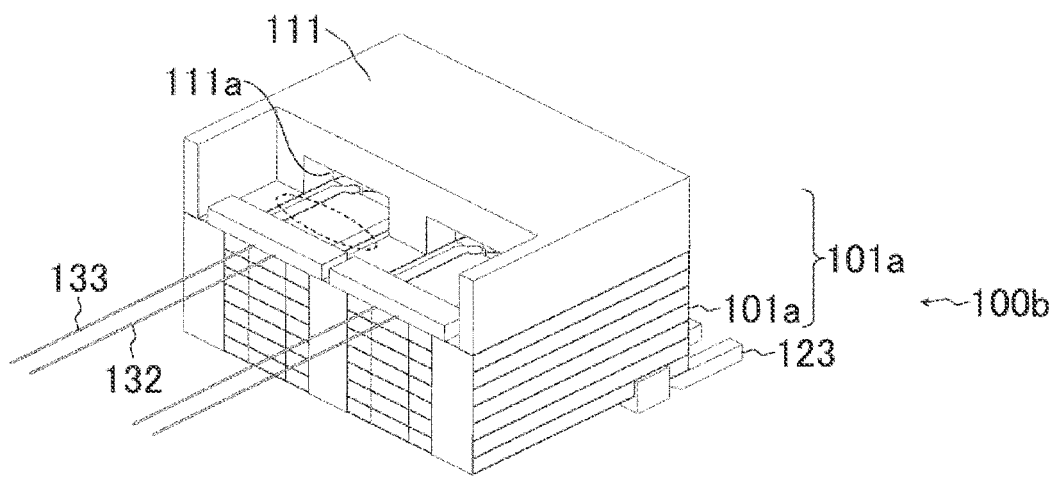
FIG. 6B is a perspective view showing the configuration of the high-frequency package according to the sixth embodiment of the present invention.

A high-frequency package 100b according to the sixth embodiment of the present invention will be described next with reference to FIGS. 6A and 6B. The high-frequency package 100b includes a cover material 111 formed to cover the surface of a substrate 101a. The cover material 111 includes an upper surface concave portion 111a (FIG. 6B) that is formed not to close a surface concave portion 108 by selectively removing the cover material 111 near the portion immediately above the surface concave portion 108 (see FIGS. 5B and 5C). Since air or vacuum exists in the surface concave portion 108 and the upper surface concave portion 111a (see FIG. 6B), the relative permittivity is 1, and rise of the electrical capacitance along with rise of the relative permittivity near a first connecting portion 105 and lowering of characteristic impedance caused by this are suppressed.

As described above, according to embodiments of the present invention, a concave portion is formed in the depth direction of the insulator layer in the connecting portion between the coplanar line and the pseudo coaxial line. It is therefore possible to obtain matching of characteristic impedance in the connecting portion between the coplanar line and the pseudo coaxial line, when the coplanar line and the pseudo coaxial line make an almost right angle, prevent a high-frequency signal from leaking to the outside because it cannot be completely bent at the connecting portion, and smoothly perform propagation of the high-frequency signal without reflection in the connecting portion.

Note that the present invention is not limited to the above-described embodiments, and it is obvious that many modifications and combinations can be made by a person skilled in the art in this field within the technical scope of the present invention. In the modifications and combinations, for example, the material of the substrate that forms the high-frequency package main body is not limited to ceramic, and the present invention can be implemented using quartz or a resin, as a matter of course. In addition, the chip mounted in the high-frequency package is not limited to a photoelectric conversion chip, and it may be a direct-modulation semiconductor laser, a semiconductor laser with a monolithic external modulator, or an optical modulator, as a matter of course.

Explanation of the Reference Numerals and Signs

100 . . . high-frequency package, 101 . . . package main body, 101a . . . substrate, 102 . . . first coplanar line, 103 . . . second coplanar line, 104 . . . pseudo coaxial line, 105 . . . first connecting portion, 106 . . . second connecting portion, 107 . . . back surface concave portion, 121 . . . first signal lead pin, 122 . . . second signal lead pin, 123 . . . ground lead pin, 131 . . . photoelectric conversion chip, 132 . . . optical fiber, 133 . . . optical fiber.

The invention claimed is:

1. A high-frequency package comprising:
a package main body including a substrate formed of alternately laminated insulating layers and conductor layers;
a first coplanar line on a first surface of the substrate;
a second coplanar line on a second surface of the substrate that is on a mounting surface of the package main body;
a pseudo coaxial line extending through the substrate, the pseudo coaxial line being connected to the first coplanar line at a first connecting portion and connected to the second coplanar line at a second connecting portion;
a first signal lead pin arranged on the mounting surface of the package main body and having a first end connected to a first signal line of the second coplanar line;
a second signal lead pin arranged on the mounting surface of the package main body and having a first end connected to a second signal line of the second coplanar line;
a ground lead pin arranged on the mounting surface of the package main body and having a first end connected to a ground line of the second coplanar line; and
a first surface concave portion on the first surface of the substrate, such that the first connecting portion of the pseudo coaxial line is exposed therein or a second surface concave portion on the second surface of the substrate such that the second connecting portion of the pseudo coaxial line is exposed therein,
wherein the first signal line and the second signal line of the second coplanar line are embedded in the substrate,
wherein the second surface concave portion is on the second surface of the substrate in a layer where the first signal line and the second signal line of the second coplanar line are not disposed.

2. The high-frequency package according to claim 1, wherein:
the pseudo coaxial line comprises an insulator; and
in the second surface concave portion, a part of the pseudo coaxial line is free of the insulator, wherein the part of the pseudo coaxial line extends to an interior of the substrate.

3. The high-frequency package according to claim 1, wherein:
the pseudo coaxial line comprises an insulator; and
in the first surface concave portion, a part of the pseudo coaxial line is free of the insulator, wherein the part of the pseudo coaxial line extends to an inside interior of the substrate.

4. The high-frequency package according to claim 1, further comprising a cover material covering the first surface of the substrate, wherein the cover material includes an upper surface concave portion that does not cover the first surface concave portion.

5. The high-frequency package according to claim 1, wherein:
the first coplanar line or the second coplanar line is a differential coplanar line in which the first signal line and the second signal line are electromagnetically coupled with each other.

6. The high-frequency package according to claim 5, wherein:
the pseudo coaxial line comprises an insulator; and
the substrate includes, on an inner side of the first surface concave portion, a hole portion in which a part of the pseudo coaxial line between the first coplanar line and the second coplanar line is free of the insulator.

7. A method comprising:
providing a package main body including a substrate formed of alternately laminated insulating layers and conductor layers;
forming a first coplanar line on a first surface of the substrate;
forming a second coplanar line on a second surface of the substrate that is on a side of a mounting surface of the package main body;
forming a pseudo coaxial line extending through the substrate, the pseudo coaxial line being connected to the first coplanar line at a first connecting portion and connected to the second coplanar line at a second connecting portion;
arranging a first signal lead pin on the mounting surface of the package main body and having a first end connected to a first signal line of the second coplanar line;
arranging a second signal lead pin on the mounting surface of the package main body and having a first end connected to a second signal line of the second coplanar line;
arranging a ground lead pin on the mounting surface of the package main body and having a first end connected to a ground line of the second coplanar line; and
forming a first surface concave portion on the first surface of the substrate, such that the first connecting portion of the pseudo coaxial line is exposed therein or forming a second surface concave portion on the second surface of the substrate such that the second connecting portion of the pseudo coaxial line is exposed therein,
wherein the first signal line and the second signal line of the second coplanar line are embedded in the substrate, and
wherein the second surface concave portion is on the second surface of the substrate in a layer where the first signal line and the second signal line of the second coplanar line are not disposed.

8. The method according to claim 7, wherein:
in the first surface concave portion, a part of an insulator of the pseudo coaxial line is removed.

9. The method according to claim 8, wherein:
the first coplanar line or the second coplanar line is a differential coplanar line in which the first signal line and the second signal line are electromagnetically coupled with each other.

10. The method according to claim 9, wherein:
the substrate includes, on an inner side of the first surface concave portion, a hole portion in which a part the pseudo coaxial line between the first coplanar line and the second coplanar line is removed.

11. The method according to claim 7, further comprising forming a cover material to cover the first surface of the substrate, wherein the cover material includes an upper surface concave portion formed not to cover the first surface concave portion.

12. The method according to claim 7, wherein:
in the second surface concave portion, a part of the pseudo coaxial line is removed.

* * * * *